(12) United States Patent
Saito

(10) Patent No.: US 8,835,227 B2
(45) Date of Patent: Sep. 16, 2014

(54) SEMICONDUCTOR DEVICE FABRICATION METHOD AND SEMICONDUCTOR DEVICE

(75) Inventor: Hirokazu Saito, Tokyo (JP)

(73) Assignee: LAPIS Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 13/482,847

(22) Filed: May 29, 2012

(65) Prior Publication Data

US 2012/0306068 A1 Dec. 6, 2012

(30) Foreign Application Priority Data

May 30, 2011 (JP) .................. 2011-120759

(51) Int. Cl.

| H01L 21/00 | (2006.01) |
|---|---|
| H01L 23/31 | (2006.01) |
| H01L 25/00 | (2006.01) |
| H01L 23/538 | (2006.01) |
| H01L 25/065 | (2006.01) |
| H01L 23/498 | (2006.01) |
| H01L 23/00 | (2006.01) |

(52) U.S. Cl.
CPC ............ *H01L 23/3114* (2013.01); *H01L 24/20* (2013.01); *H01L 2224/12105* (2013.01); *H01L 2224/19* (2013.01); *H01L 2224/80904* (2013.01); *H01L 2225/06548* (2013.01); *H01L 24/13* (2013.01); *H01L 2224/055571* (2013.01); *H01L 25/50* (2013.01); *H01L 23/5389* (2013.01); *H01L 2224/221* (2013.01); *H01L 24/19* (2013.01); *H01L 2224/13023* (2013.01); *H01L 25/0657* (2013.01); *H01L 2924/01029* (2013.01); *H01L 2224/05573* (2013.01); *H01L 23/49816* (2013.01); *H01L 2224/214* (2013.01); *H01L 2225/06524* (2013.01)
USPC .................... 438/125; 438/456; 257/E21.576

(58) Field of Classification Search
None
See application file for complete search history.

(56) References Cited

U.S. PATENT DOCUMENTS

| 2010/0213601 A1* | 8/2010 | Smeys et al. ................. 257/698 |
| 2011/0315555 A1* | 12/2011 | Saito et al. .................... 205/118 |

FOREIGN PATENT DOCUMENTS

| JP | 2004-186497 A | 7/2004 |
| JP | 2007-103714 A | 4/2007 |
| JP | 2007-103715 A | 4/2007 |
| JP | 2007-103716 A | 4/2007 |

OTHER PUBLICATIONS

Yoon et al. "Polymer Embedded Module for SiP Application." 2004, Electronics Packaging Technology Conference.*
Yoon et al. "Polymer Module for SiP Application." 2004, Electronics Packaging Technology Conference.*

* cited by examiner

*Primary Examiner* — Julio J Maldonado
*Assistant Examiner* — Joseph Galvin, III
(74) *Attorney, Agent, or Firm* — Studebaker & Brackett PC

(57) ABSTRACT

A semiconductor device is manufactured by forming a first dielectric film on a substrate, forming an aperture in the first dielectric film, mounting a semiconductor chip in the aperture, forming a second dielectric film on the first dielectric film and the semiconductor chip, and forming an interconnection wiring structure on the second dielectric film. The second dielectric film secures the semiconductor chip without the need to etch the substrate or use an adhesive die attachment film.

4 Claims, 5 Drawing Sheets

SEMICONDUCTOR DEVICE FABRICATION METHOD AND SEMICONDUCTOR DEVICE

FIELD OF THE INVENTION

The present invention relates to a semiconductor device and a method of fabricating the semiconductor device. More particularly, it relates to a fabrication method that forms an interconnection wiring structure for a semiconductor chip after the semiconductor chip is secured to a substrate.

DESCRIPTION OF THE RELATED ART

The need for this type of fabrication method arises in multichip wafer-level chip size packaging (multichip WCSP).

In Japanese Patent Application Publications No. 2007-103714, 2007-103715, and 2007-103716, Yamagata proposes multichip WCSP fabrication methods in which semiconductor chips are secured to a semiconductor substrate by means of a die attachment film. These methods, however, have the drawback of requiring a heat treatment process that takes considerable time, and the die attachment film must be aligned separately for each semiconductor chip, which also takes time.

A fabrication process in which the substrate is etched before the semiconductor chips are attached by films is also known, but this etching process takes further time, and tends to damage the substrate by introducing crystal defects.

SUMMARY OF THE INVENTION

An object of the present invention is to reduce the fabrication time of a semiconductor device having a semiconductor chip mounted on a substrate.

Another object of the invention is to avoid damaging the crystalline structure of a substrate on which a semiconductor chip is mounted to fabricate a semiconductor device.

According to the present invention, a semiconductor device is manufactured by:

forming a first dielectric film on a substrate;

forming an aperture in the first dielectric film;

mounting a semiconductor chip in the aperture;

forming a second dielectric film on the first dielectric film and the semiconductor chip; and forming an interconnection wiring structure on the second dielectric film. The interconnection wiring structure is electrically connected to the semiconductor chip.

The second dielectric film secures the semiconductor chip in place on the substrate. Fabrication time is shortened because it is not necessary to position or heat an adhesive film to secure the semiconductor chip. Damage to the crystalline structure of the substrate is avoided because it is not necessary to etch the substrate to mount the semiconductor chip.

The invention also provides a semiconductor device including a substrate, a first dielectric film formed on the substrate and having an aperture, a semiconductor chip mounted in the aperture, a second dielectric film covering the first dielectric film and the semiconductor chip, and an interconnection wiring structure formed on the second dielectric film and electrically connected to the semiconductor chip.

DETAILED DESCRIPTION OF THE INVENTION

Figure 1:
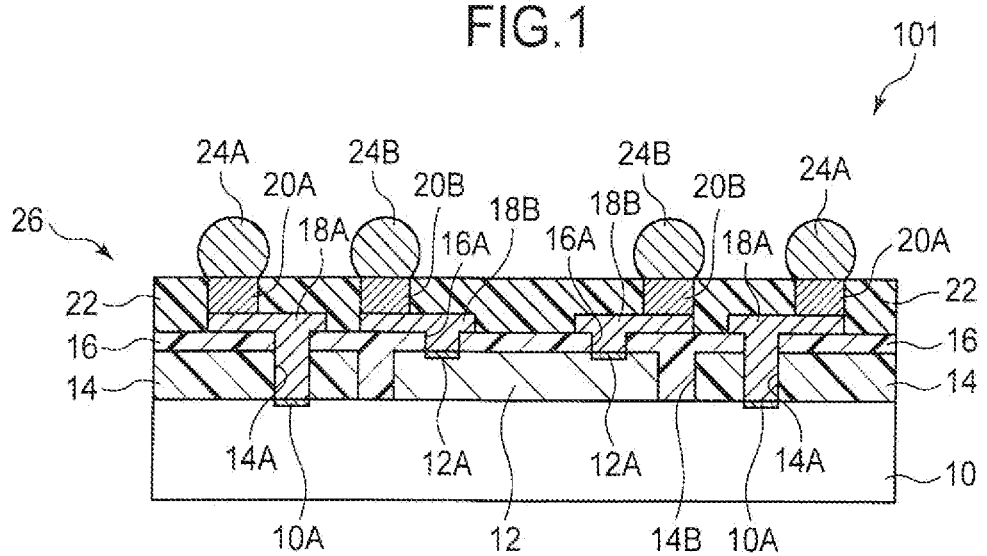
FIG. 1 is a schematic cross-sectional view illustrating a semiconductor device fabricated according to the present invention.

Embodiments of the invention will be described with reference to the attached drawings, in which like elements are indicated by like reference characters. The substrate on which the semiconductor chip is mounted in these embodiments is a semiconductor integrated circuit, that is, another semiconductor chip, or a semiconductor wafer including a plurality of integrated circuits.

The embodiment shown in FIG. 1 is a semiconductor device 101 including a first semiconductor chip 10 and a second semiconductor chip 12 mounted on the first semiconductor chip 10. The first semiconductor chip 10 includes, for example, an integrated circuit (not shown). Pad electrodes 10A that are electrically connected to the integrated circuit are formed on a main surface of the first semiconductor chip 10. The main surface of the first semiconductor chip 10 may also be covered by a protective film (not shown) having openings through which the pad electrodes 10A are exposed.

The second semiconductor chip 12 includes, for example, another integrated circuit (not shown). Pad electrodes 12A that are electrically connected to this integrated circuit are formed on the main surface of the second semiconductor chip 12.

The main surface of the first semiconductor chip 10 is also covered by a first dielectric film 14 having an aperture 14B within which the second semiconductor chip 12 is mounted. A second dielectric film 16 is formed on the first dielectric film 14 and second semiconductor chip 12, covering both of them. The aperture 14B in the first dielectric film 14 is larger than the second semiconductor chip 12, so gaps are left between the side walls of the aperture 14B and the side walls or edges of the second semiconductor chip 12. The second dielectric film 16 also fills in these gaps.

An interconnection wiring structure 26, electrically connected to the first and second semiconductor chips 10, 12, is formed on the second dielectric film 16.

The interconnection wiring structure 26 includes interconnection wiring 18A electrically connected to the pad electrodes 10A of the first semiconductor chip 10 through contact holes 14A formed in the first dielectric film 14 and second dielectric film 16, and post electrodes 20A that extend from parts of the interconnection wiring 18A, to which the post electrodes 20A are electrically connected.

The interconnection wiring structure 26 also includes interconnection wiring 18B electrically connected to the pad electrodes 12A of the second semiconductor chip 12 through contact holes 16A formed in the second dielectric film 16, and post electrodes 20B that extend from parts of the interconnection wiring 18B, to which the post electrodes 20B are electrically connected.

The interconnection wiring 18A, 18B is also known as redistribution wiring or relocation wiring.

The second dielectric film 16 and interconnection wiring 18A, 18B are covered by an interlayer dielectric film 22. The interconnection wiring 18A, 18B is located generally between the second dielectric film 16 and the interlayer dielectric film 22. The post electrodes 20A, 20B extend through holes in the interlayer dielectric film 22 and their top surfaces are flush with the top surface of the interlayer dielectric film 22.

The interconnection wiring structure 26 also includes external interconnection terminals or bumps 24A, 24B.

Bumps 24A are formed on, for example, the top surfaces of post electrodes 20A and are electrically connected through post electrodes 20A and interconnection wiring 18A to the pad electrodes 10A of the first semiconductor chip 10.

Bumps 24B are formed on, for example, the top surfaces of post electrodes 20B and are electrically connected through post electrodes 20B and interconnection wiring 18B to the pad electrodes 12A of the second semiconductor chip 12.

Further details of the semiconductor device 101 and a method of fabricating it will now be described with reference to FIGS. 2 to 10.

Figure 2:
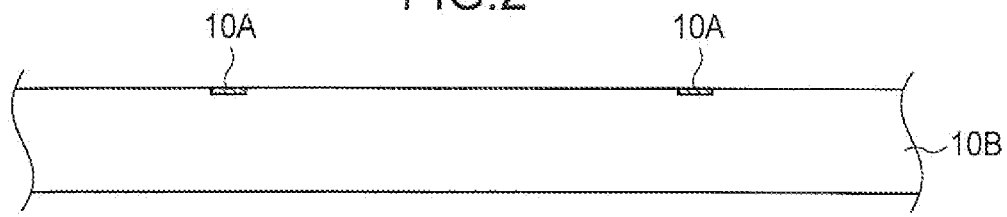
FIGS. 2 to 8 illustrate a fabrication process for the semiconductor device in FIG. 1.

The illustrated fabrication method starts with the formation of a plurality of first semiconductor chips with respective integrated circuits and pad electrodes 10A on a semiconductor wafer 10B. FIG. 2 shows part of one first semiconductor chip and two of its pad electrodes 10A. At this point the first semiconductor chips may already include one or more layers of metal interconnection wiring, which are not explicitly shown but are treated as part of the wafer 10B.

Figure 3:
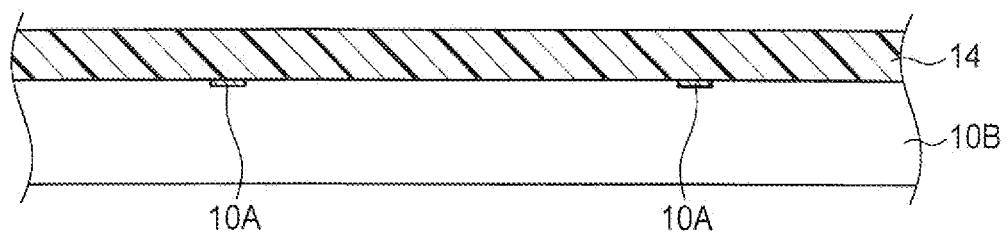

Next, as shown in FIG. 3, the first dielectric film 14 is formed on the wafer 10B. The first dielectric film 14 may be formed by spin coating, printing, chemical vapor deposition (CVD), sputtering, or another method appropriate for the constituent material of the first dielectric film 14.

The first dielectric film 14 may be a resin film such as a film of polyimide resin, silicon-containing polyimide resin, epoxy resin, benzocyclobutene (BCB) resin, or p-phenylene benzobisoxazole (PBO) resin, or an inorganic film such as a silicon-oxide film or a silicon-nitride film. From the viewpoints of ease of film formation and processing (aperture formation), a resin film of the photoresist type is preferable. In terms of versatility and processability, a polyimide resin film is preferable and a polyimide resin photoresist film is particularly preferable.

The thickness of the first dielectric film 14 may be equal to, less than, or greater than the thickness of the second semiconductor chip 12. In this embodiment, the first dielectric film 14 is shown as having the same thickness as the second semiconductor chip 12. From the viewpoint of ease of handling of the second semiconductor chip 12 when the second semiconductor chip 12 is mounted within the aperture 14B in the first dielectric film 14 as described below, however, the first dielectric film 14 is preferably thinner than the second semiconductor chip 12.

Figure 4:
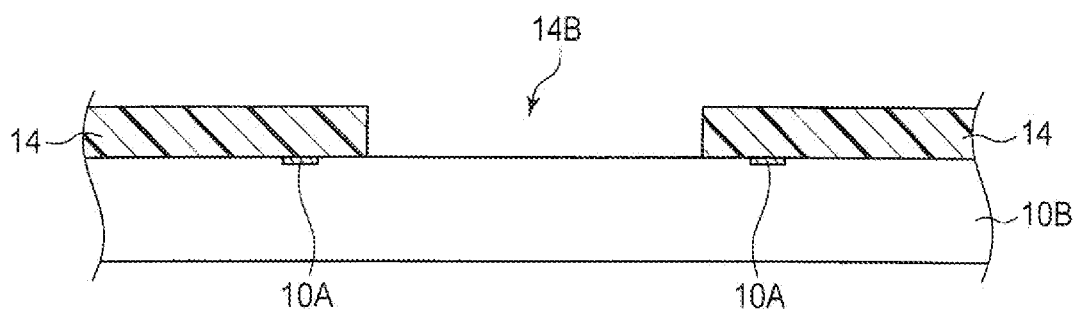

Next, apertures 14B are formed in the first dielectric film 14 over the first semiconductor chips in the wafer 10B. FIG. 4 shows one aperture 14B. The apertures 14B may be formed by, for example, lithography and dry etching, or by another method appropriate for the constituent material of the first dielectric film 14.

Figure 9:
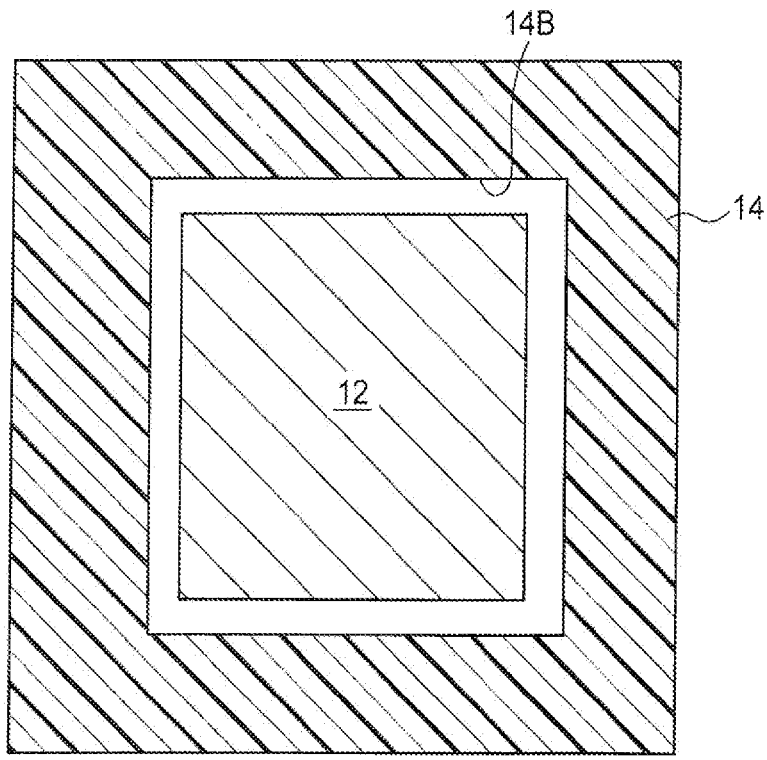
FIG. 9 is a plan view corresponding to FIG. 5, showing the semiconductor chip mounted within the aperture in the first dielectric film.

In plan view, each aperture 14B is similar in shape to the second semiconductor chip 12 that will be mounted within it, but is larger in size than the second semiconductor chip 12, as best seen in FIG. 9. More specifically, the size of the aperture 14B is larger than the size of the second semiconductor chip 12 when measured in a plane parallel to the wafer substrate 10B.

The aperture 14B penetrates completely through the first dielectric film 14, exposing the main surface of the underlying substrate. That is, the surface of the wafer 10B or the first semiconductor chip is exposed.

Figure 5:
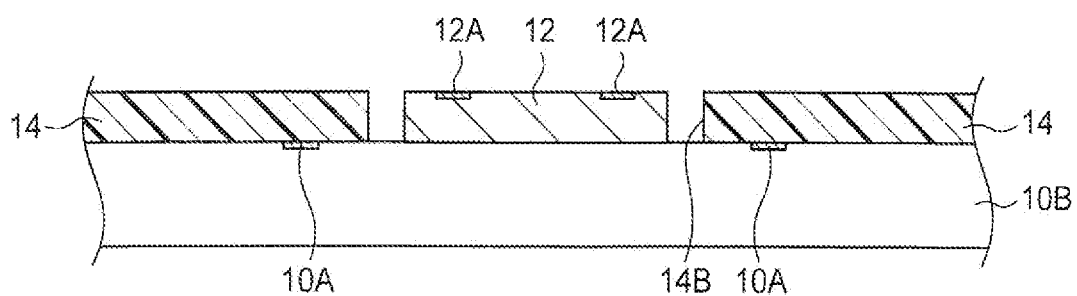

Next, as shown in FIG. 5, a second semiconductor chip 12 is mounted face-up in each aperture 14B in the first dielectric film 14. Face-up means that the main surface of the second semiconductor chip 12, on which the pad electrodes 12A are formed, faces away from the wafer 10B. The second semiconductor chips 12 are placed within the apertures 14B in this position but are not yet permanently secured.

Figure 6:
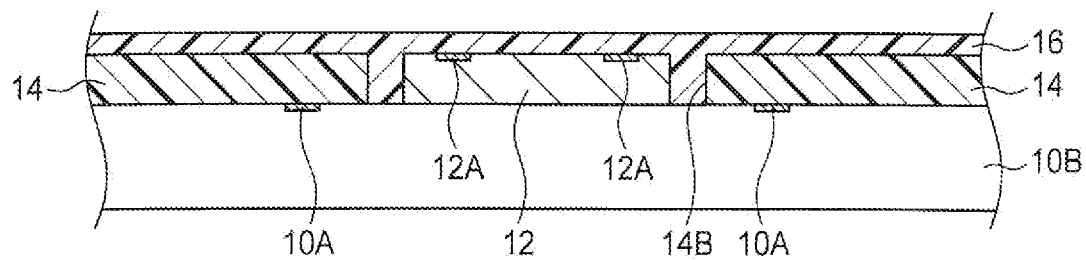

Next, as shown in FIG. 6, the second dielectric film 16 is formed, covering both the second semiconductor chips 12 and the first dielectric film 14 and filling the gaps between the side walls of the apertures 14B in the first dielectric film 14 and the edges of the second semiconductor chips 12. The second dielectric film 16 may formed by spin coating, printing, CVD, sputtering, or any other method appropriate for the constituent material of the second dielectric film 16. Formation of the second dielectric film 16 secures the second semiconductor chips 12 in the positions in which they were placed in FIG. 5.

The second dielectric film 16 may be a resin film or an inorganic film of any of the types mentioned above. A polyimide resin photoresist film is preferred.

Figure 7:
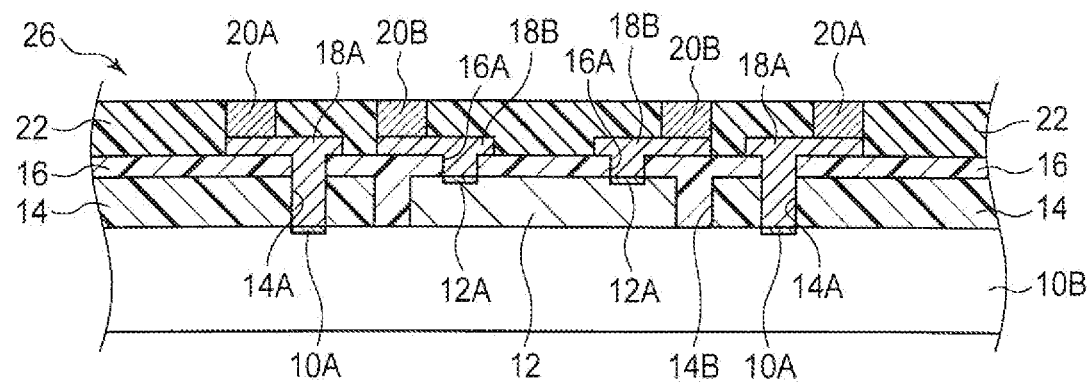

Next, as shown in FIG. 7, the interconnection wiring structure 26 is formed on the second dielectric film 16.

More specifically, first, contact holes 14A leading to the pad electrodes 10A of the first semiconductor chip 10 are formed in the first and second dielectric films 14, 16. These contact holes 14A may be formed by photolithography and dry etching, for example, or any other method suitable for the materials constituting the first and second dielectric films 14, 16.

Similarly, contact holes 16A leading to the pad electrodes 12A of the second semiconductor chip 12 are formed in the second dielectric film 16 by, for example, lithography and dry etching.

Next, interconnection wiring 18A is formed on the second dielectric film 16, filling contact holes 14A and making electrical contact with the pad electrodes 10A on the wafer 10B (on the first semiconductor chips). Similarly, interconnection wiring 18B is formed on the second dielectric film 16, filling contact holes 16A and making electrical contact with the pad electrodes 12A on the second semiconductor chips 12. This interconnection wiring 18A, 18B may be made of a metal such as tungsten (W), copper (Cu), or aluminum (Al), and may be formed by a plating process.

The interconnection wiring 18A, 18B need not completely fill the contact holes 14A, 16A, provided electrical contact is made with the pad electrodes at the bottom of the contact holes.

Figure 10:
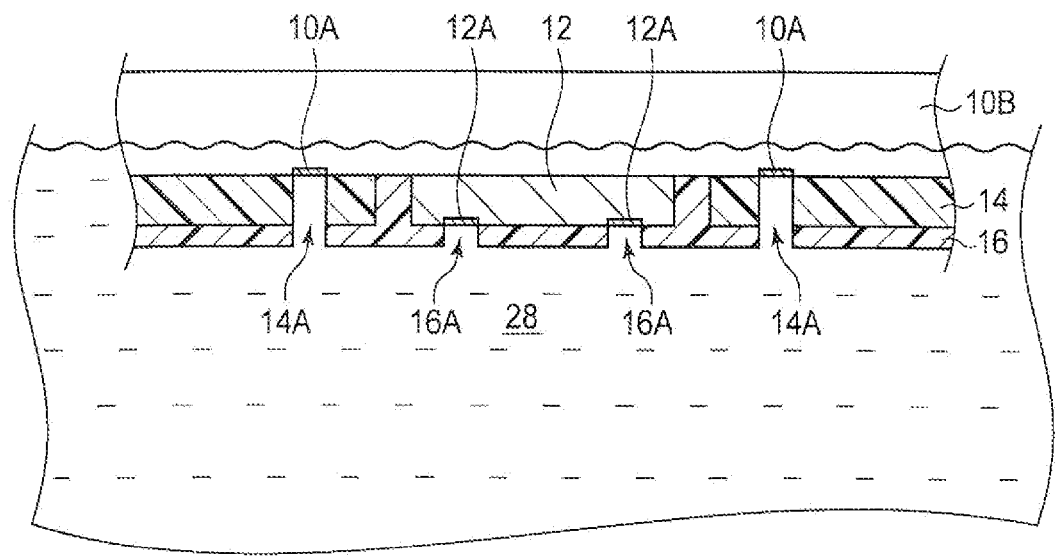
FIG. 10 is a schematic cross-sectional view corresponding to FIG. 7, illustrating a plating step in the formation of the interconnection wiring structure.

The formation of the interconnection wiring 18A, 18B may include a plating process. In a preferred plating process, the wafer 10B is immersed in a plating solution 28 with its main surface, including the second semiconductor chips 12, first dielectric film 14, and second dielectric film 16, facing downward. Downward is defined by the force of gravity; the second semiconductor chip 12 is gravitationally below the main surface of the wafer 10B. As shown in FIG. 10, the wafer 10B need only be immersed far enough to allow the plating solution 28 to fill the contact holes 14A, 16A. Alternatively, the plating process may be carried out with the wafer 10B completely immersed, its main surface facing upward.

Although not shown in the drawings, the plating process is preferably preceded by formation of a seed film of titanium nitride (TiN), titanium-copper (Ti/Cu), or another alloy that promotes growth and adhesion of the plating layer. The seed film should be formed at least on the parts of the second dielectric film 16 on which the interconnection wiring 18A and 18B will be formed, including the side walls of the contact holes 14A, 16A, and the pad electrodes 10A, 12A exposed by the contact holes. The seed film may formed by sputtering or another appropriate method.

Following formation of the interconnection wiring 18A and 18B, plating, sputtering, or another method is used to form the post electrodes 20A that make electrical contact with parts of interconnection wiring 18A, and the post electrodes 20B that make electrical contact with parts of interconnection wiring 18A. The post electrodes may be formed from tungsten, copper, aluminum, or another suitable metal.

Then the interlayer dielectric film 22 is formed on the second dielectric film 16 to cover the interconnection wiring 18A, 18B and post electrodes 20A, 20B. The interlayer dielectric film 22 may be formed by spin coating, printing, CVD, sputtering, or another method appropriate for the constituent material of the interlayer dielectric film 22. The surface of the interlayer dielectric film 22 is cut back as necessary to expose the top surfaces of the post electrodes 20A, 20B.

Sequential formation of the interconnection wiring 18A, 18B, post electrodes 20A, 20B, and interlayer dielectric film 22 in this way completes the formation of the interconnection wiring structure 26 except for the external terminals or bumps.

The interconnection wiring structure 26 is not limited to the structure described above. For example it may have a multilayer structure or some other known wiring structure.

Figure 8:
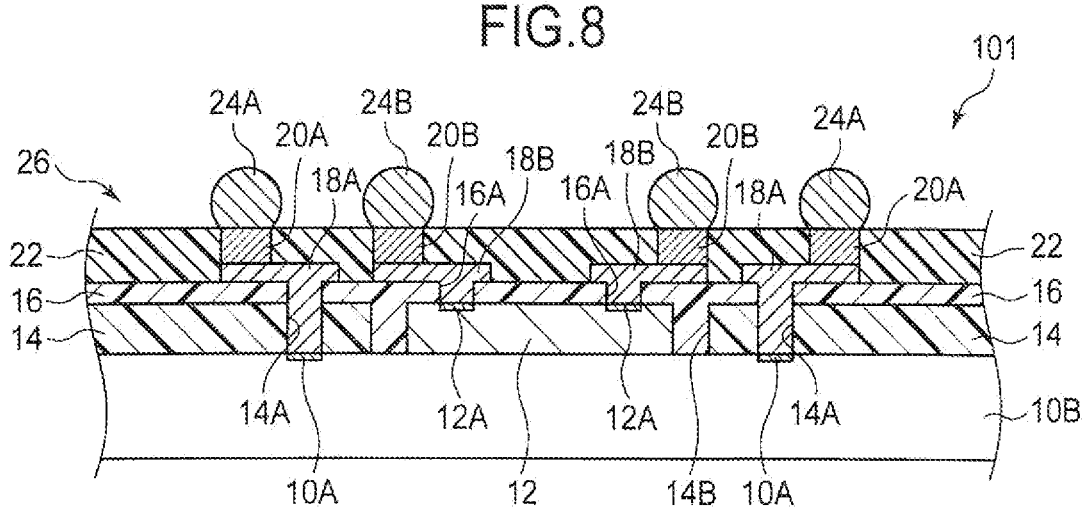

Next, as shown in FIG. 8, for example, the bumps 24A, 24B that function as external electrical terminals for the semiconductor chips 10, 12 are formed on the exposed top surfaces of the post electrodes 20A and 20B.

Finally, the wafer 10B is ground down to a desired thickness, if necessary, by a backgrinder, for example, and is then diced into chips.

The above procedure fabricates the semiconductor device 101 by a method that can be summarized as follows. A first dielectric film 14 is formed on a substrate such as a wafer 10B or a first semiconductor chip 10. One or more apertures 14B are formed in the first dielectric film 14. A semiconductor chip (the second semiconductor chip 12 in this embodiment) is placed in each aperture 14B. A second dielectric film 16 is formed on the first dielectric film 14, covering each second semiconductor chip 12 and filling the remaining space around the second semiconductor chip 12 in the aperture 14B, thereby securing the second semiconductor chip 12 in place on the substrate.

The second semiconductor chip 12 is secured by the second dielectric film 16 without using an adhesive film or etching the substrate (the wafer 10B or first semiconductor chip 10). The above fabrication method is less time consuming than conventional methods that require heat treatment of an adhesive film. Thermal stress on the substrate caused by such heat treatment is also eliminated, and since the substrate is not etched, damage to its crystalline structure is avoided.

A further advantage is that a multichip WCSP semiconductor device with a second semiconductor chip 12 mounted on a first semiconductor chip 10 can be manufactured without extra fabrication steps for positioning of the second semiconductor chip 12.

Since the apertures 14B in this embodiment extend completely through the first dielectric film 14, each second semiconductor chip 12 rests directly on the substrate (the wafer 10B or first semiconductor chip 10). One advantage of this arrangement is that it minimizes the thickness of the first dielectric film 14. Another advantage is that level mounting of the second semiconductor chip 12 is assured. The contact holes 16A extending through the second dielectric film 16 therefore all have the same depth, and the parts of the interconnection wiring 18B extending through the contact holes 16A to the pad electrodes 12A on the surface of the second semiconductor chip 12 all have the same height, which simplifies reliable formation of the contact holes 16A and interconnection wiring 18B and reduces the likelihood of electrical continuity faults.

Figure 11:
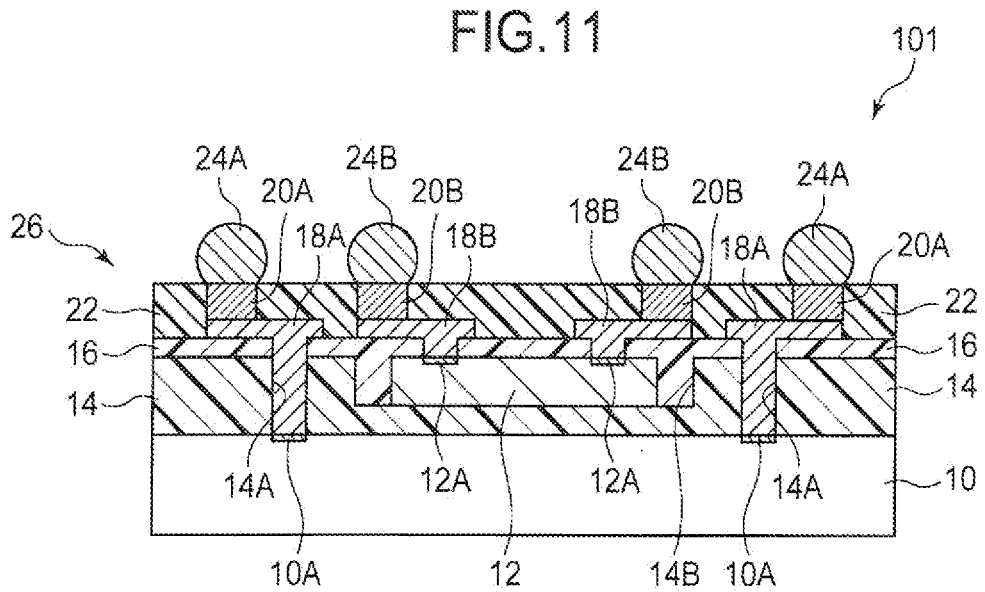
FIG. 11 is a schematic cross-sectional view illustrating another semiconductor device fabricated according to the invention.

Referring to FIG. 11, in an alternative embodiment, the apertures 14B do not penetrate completely through the first dielectric film 14. The apertures 14B are formed as depressions in the first dielectric film 14 without exposure of the main surface of the first semiconductor chips 10 in the wafer substrate. The depth of such non-penetrating apertures 14B may be equal to, less than, or greater than the thickness of the second semiconductor chips 12, but from the viewpoint of ease of handling of the second semiconductor chips 12 when the second semiconductor chips 12 are mounted within the apertures 14B, the depth of the apertures 14B is preferably less than the thickness of the second semiconductor chip 12. This alternative embodiment may be used to improve the positioning accuracy of the second semiconductor chips 12, as described below.

In either embodiment, once the second dielectric film 16 is formed, each second semiconductor chip 12 is immobilized and cannot shift position or drop off during subsequent processing and handling of the first semiconductor chip 10. This feature enables the interconnection wiring 18A and 18B to be formed by plating with the first semiconductor chip 10 immersed in a plating solution 28 as shown in FIG. 10, with its main surface facing downward, which simplifies the holding of the wafer 10B during the plating process.

As noted above, the first and second dielectric films 14, 16 may be polyimide resin photoresist films. Polyimide resin is a versatile material that is readily processable, which reduces the cost of the fabrication process. The photoresist property enables the apertures 14B and contact holes 16A to be formed with high precision. High-precision formation of the apertures 14B leads to high positioning precision of the second semiconductor chips 12.

A polyimide resin photoresist film is also advantageous in the alternative embodiment in which the apertures 14B do not extend completely through the first dielectric film 14. Referring again to FIG. 11, the adhesive properties of this resin film make the second semiconductor chip 12 stick to the resin floor at the bottom of each aperture 14B. This improves the positioning accuracy of the second semiconductor chip 12 by preventing the second semiconductor chip 12 from shifting position before the second dielectric film 16 is formed.

Although the invention has been described in relation to the formation of a plurality of semiconductor devices on a wafer, it is also applicable to the formation of a single semiconductor device.

The substrate on which the semiconductor chip or chips 12 are mounted need not be a semiconductor substrate in which integrated circuits are formed. The substrate may be a semiconductor substrate (such as a silicon substrate) lacking integrated circuitry, or a metal substrate, or any other type of substrate.

Those skilled in the art will recognize that further variations are possible within the scope of the invention, which is defined in the appended claims.

What is claimed is:

1. A method of manufacturing a semiconductor device that includes a first semiconductor chip and a second semiconductor chip formed above the first semiconductor chip, the method comprising:

preparing a semiconductor substrate that includes the first semiconductor chip having an integrated circuit, the first semiconductor chip being formed in a first main surface of the semiconductor substrate;

removing a part of a first dielectric layer of a photoresist type as a single layer formed on the first main surface of the semiconductor substrate by lithography, thereby forming a recess in the first dielectric layer so that a bottom surface of the recess is formed by the first dielectric layer and does not reach the first main surface of the semiconductor substrate;

mounting the second semiconductor chip including a first electrode pad on the bottom surface of the recess, the bottom surface of the recess having adhesive properties;

forming a second dielectric layer so as to cover the first dielectric layer and the second semiconductor chip;

forming a first aperture penetrating the second dielectric layer so that the first electrode pad is exposed to the first aperture; and forming a first wiring extending from the first electrode pad to an upper surface of the second dielectric layer, the first wiring being electrically connected to the first electrode pad.

2. The method of claim 1, further comprising:
forming a post electrode on the first wiring;
forming a third dielectric layer which covers the post electrode;
grinding a part of the third dielectric layer to expose a top portion of the post electrode; and
forming a terminal on the top portion of the post electrode.

3. The method of claim 1, wherein the semiconductor substrate includes a second electrode electrically connected to the integrated circuit of the first semiconductor chip; the method further comprising:

forming a second aperture penetrating the second and first dielectric layers so that the second electrode pad is exposed to the second aperture;

forming a second wiring extending from the second electrode pad to the upper surface of the second dielectric layer, the second wiring being electrically connected to the second electrode pad;

forming a post electrode on the second wiring;
forming a third dielectric layer which covers the post electrode;
grinding a part of the third dielectric layer to expose a top portion of the post electrode; and
forming a terminal on the top portion of the post electrode.

4. A method of manufacturing a semiconductor device that includes a first semiconductor chip and a second semiconductor chip formed above the first semiconductor chip, the method comprising:

preparing a semiconductor substrate that includes the first semiconductor chip having an integrated circuit, the first semiconductor chip being formed in a first main surface of the semiconductor substrate;

forming a first dielectric layer of a photoresist type as a single layer on the first main surface of the semiconductor substrate;

removing a part of the first dielectric layer by lithography to form a recess in the first dielectric layer so that a bottom surface of the recess is formed by the first dielectric layer and does not reach the first main surface of the semiconductor substrate;

mounting the second semiconductor chip including a first electrode pad on the bottom surface of the recess, the bottom surface of the recess having adhesive properties;

forming a second dielectric layer so as to cover the first dielectric layer and the second semiconductor chip;

forming a first aperture penetrating the second dielectric layer so that the first electrode pad is exposed to the first aperture; and forming a first wiring extending from the first electrode pad to an upper surface of the second dielectric layer, the first wiring being electrically connected to the first electrode pad.

* * * * *